United States Patent
Tihanyi et al.

(10) Patent No.: US 6,411,484 B1
(45) Date of Patent: Jun. 25, 2002

(54) VLSI CIRCUIT WITH TEMPERATURE MONITORING

(75) Inventors: Jenoe Tihanyi, Kirchheim; Horst Schäfer, Landsberg Am Lech, both of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/275,380

(22) Filed: Mar. 24, 1999

(30) Foreign Application Priority Data

Mar. 24, 1998 (DE) .......................... 198 12 921

(51) Int. Cl.$^7$ ............................... H02H 5/00
(52) U.S. Cl. ...................... 361/103; 361/106
(58) Field of Search ................ 361/115, 103, 361/106, 18

(56) References Cited

U.S. PATENT DOCUMENTS 5,713,030 A * 1/1998 Evoy .......................... 395/750
5,752,011 A * 5/1998 Thomas et al. ............. 395/556

FOREIGN PATENT DOCUMENTS

| DE | 290 512 A5 | 5/1991 | ........... H01L/23/46 |
| EP | 0 208 970 B1 | 5/1990 | ........... H01L/25/18 |
| EP | 0 701 279 A1 | 3/1996 | ......... H01L/23/467 |

OTHER PUBLICATIONS

International Patent Application WO 95/30200 (Kikinis), dated Nov. 9, 1995.
Japanese Patent Abstract No. 2–52263 (A) (Takahashi), dated Feb. 21, 1990.
Japanese Patent Abstract No. 58–73145 (A)(Futaki), dated May 2, 1983.

* cited by examiner

*Primary Examiner*—Stephen W. Jackson
(74) *Attorney, Agent, or Firm*—Laurence A. Greenberg; Werner H. Stemer; Ralph E. Locher

(57) ABSTRACT

The VLSI circuit has one or more integrated semiconductor chips disposed in a housing and connected via connecting lines to contact terminals that are accessible from outside the housing. A temperature sensor chip is in thermal contact with the semiconductor chip in the housing. Connecting lines connect the temperature sensor chip to additional contact terminals of the housing.

12 Claims, 2 Drawing Sheets

VLSI CIRCUIT WITH TEMPERATURE MONITORING

BACKGROUND OF THE INVENTION

Field of the Invention

The invention lies in the field of semiconductor manufacture. Specifically, the invention relates to a VLSI circuit with temperature monitoring. The VLSI circuit has at least one integrated semiconductor chip arranged in a housing and connected via connecting lines to contact terminals that are accessible from outside the housing In general, integrated circuits designated as VLSI circuits are those in which a very large number of individual circuit components are accommodated on the semiconductor chip in an extremely small space. Examples of VLSI circuits are microprocessor chips, memory chips, etc.

In operation, particularly in continuous operation, such VLSI chips generate a considerable amount of heat, which must be dissipated in a suitable manner. Heat sinks are regularly used for this purpose. The heat sinks are cooling bodies that are physically connected to the housings of the VLSI chips in order to dissipate the heat. It is frequently the case that a temperature fan is also arranged in proximity to the VLSI chip. The fan additionally provides for sufficient heat dissipation. In this case, the heat sink and the fan are regularly dimensioned so as to enable sufficient heat dissipation. As a rule, this means an overdimensioning of the heat sink and/or of the fan motor. Such a configuration is disclosed, for example, in published European patent application EP 0 701 279 A1.

It has also been known in the art to drive the temperature fan faster as the temperature increases, that is to say to increase the rotational speed in order to provide for greater heat dissipation. Finally, it has also been known for a safety shutdown of the apparatus containing the VLSI chip, e.g. a personal computer, to be carried out in the event of overtemperature. In that case, the apparatus is disconnected from the power supply until the temperature has fallen below the critical value of the predetermined overtemperature. However, in that case the regulating device and the temperature sensor are regularly disposed outside the VLSI chip.

Integrated circuits with a temperature sensor are disclosed as such in published Japanese patent application JP 02 052263, for example. However, the latter document does not concern VLSI circuits, but rather those in which a power switch generating a heat loss is integrated in a semiconductor chip. The temperature sensor circuit is connected to the control terminal of the power switch in that case.

Such a circuit configuration is described, for example, in European patent EP 0 208 970 B1 and in Japanese application JP 58-073145 A. In order to protect the power MOSFET when an overtemperature occurs, a second semiconductor body, which contains a temperature sensor circuit and a semiconductor switch, is adhesively bonded onto a semiconductor body containing the power MOSFET. The two semiconductor bodies are in good thermal contact with one another, with the result that an overtemperature that occurs within the semiconductor body of the power MOSFET can be detected in the temperature sensor circuit. The electronic switch (e.g. a thyristor) within the second semiconductor body is connected between the source electrode and the drain electrode of the power MOSFET. If the temperature within the MOSFET rises as a result of an overload or a high ambient temperature, the electronic switch contained in the second semiconductor body short-circuits the gate electrode to the source electrode of the MOSFET. The result is that the voltage previously present in the on-state between the source electrode and the gate electrode of the MOSFET collapses and the MOSFET switches off.

SUMMARY OF THE INVENTION

It is accordingly an object of the invention to provide a VLSI circuit with a temperature monitor, which overcomes the above-mentioned disadvantages of the heretofore-known devices and methods of this general type and which ensures optimum temperature regulation of the semiconductor chip contained in the VLSI circuit.

With the foregoing and other objects in view there is provided, in accordance with the invention, a temperature-monitored VLSI circuit, comprising:

a housing with a plurality of externally accessible contact terminals;

an integrated semiconductor chip disposed in the housing and a plurality of connecting lines electrically connecting the semiconductor chip to respective the contact terminals;

a temperature sensor chip disposed in thermal contact with the semiconductor chip in the housing, and connecting lines connecting the temperature sensor chip to additional the contact terminals; and a regulating circuit for temperature regulation of the VLSI circuit connected to the additional contact terminals.

The essential concept of the invention is found in the provision that a temperature sensor chip in thermal contact with the semiconductor chip is arranged in the housing, in that connecting lines of the temperature sensor chip are connected to additional contact terminals of the housing, and in that a regulating circuit for temperature regulation of the VLSI circuit is connected to the additional contact terminals.

In accordance with an added feature of the invention, the temperature sensor chip is disposed to be completely insulated from the semiconductor chip. Furthermore, the temperature sensor chip may be at the same reference-ground potential as the semiconductor chip, or it may be provided for connection to the same supply potential as the semiconductor chip.

In accordance with an additional feature of the invention, the temperature sensor chip generates a digital output signal or an analog output signal. The output signal is processed further by a regulating device. Specifically, the output signal of the temperature sensor chip is provided as a regulating signal for initiating temperature regulation in order to keep the temperature in the housing of the VLSI chip at the location of the temperature sensor chip below a predetermined threshold value.

The temperature regulation may be implemented in a variety of ways: First, the clock frequency of the semiconductor chip may be reduced in order to reduce the heating power output of the chip. Next, the cooling air supply to the VLSI circuit may increased. It is also possible to reduced the voltage supply to the semiconductor chip. Combinations of these measures are possible as well. Finally, a complete shutdown of the circuit may be caused as a temperature regulation.

In accordance with a further feature of the invention, a fan with a fan motor is provided for cooling the VLSI circuit, and wherein the temperature sensor includes a power switch connected on an output side of the sensor chip for selectively switching the fan motor on or off. The power switch may be a Triac, a GTO, a MOSFET, or the like connected externally of the chip.

In accordance with another feature of the invention, the regulating circuit is integrated in the housing.

With the above and other objects in view there is also provided, in accordance with the invention, a temperature-monitored VLSI circuit, comprising:

a housing with a plurality of externally accessible contact terminals;

an integrated semiconductor chip disposed in the housing and a plurality of connecting lines electrically connecting the semiconductor chip to respective the contact terminals;

a temperature sensor chip disposed in thermal contact with the semiconductor chip in the housing; and a regulating circuit integrated in the housing, the regulating circuit being connected to the temperature sensor chip and regulating a temperature of the VLSI circuit.

In accordance with a concomitant feature of the invention, the regulating circuit is integrated in the temperature sensor chip and/or it is directly connected to the semiconductor chip.

To summarize, then, the invention proposes that a temperature sensor chip be fixed in the housing of the integrated circuit on the VLSI chip, which may be of any desired type and fabricated according to any desired fabrication technology, and be in thermal contact with said VLSI chip. The temperature sensor chip can be fabricated using any other fabrication technology to that of the semiconductor chip. The output signal of the temperature sensor chip, which may be digital or analogue, serves to trigger a regulating mechanism when the chip temperature increases, which regulating mechanism keeps the chip temperature below the danger limits for the VLSI chip. The influencing of the temperature can be effected e.g. by reducing the operating frequency of the VLSI chip or, alternatively, can be initiated by a change to the cooling air supply. Other possibilities are also conceivable. The essential advantage is that an intervention is made only when above-average power generation is present. It is expedient for the temperature sensor chip to be electrically connected to the housing terminals of the integrated module. For this purpose, two or more pins of the temperature sensor chip can be routed outward.

Other features which are considered as characteristic for the invention are set forth in the appended claims.

Although the invention is illustrated and described herein as embodied in a VLSI circuit with temperature monitoring, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
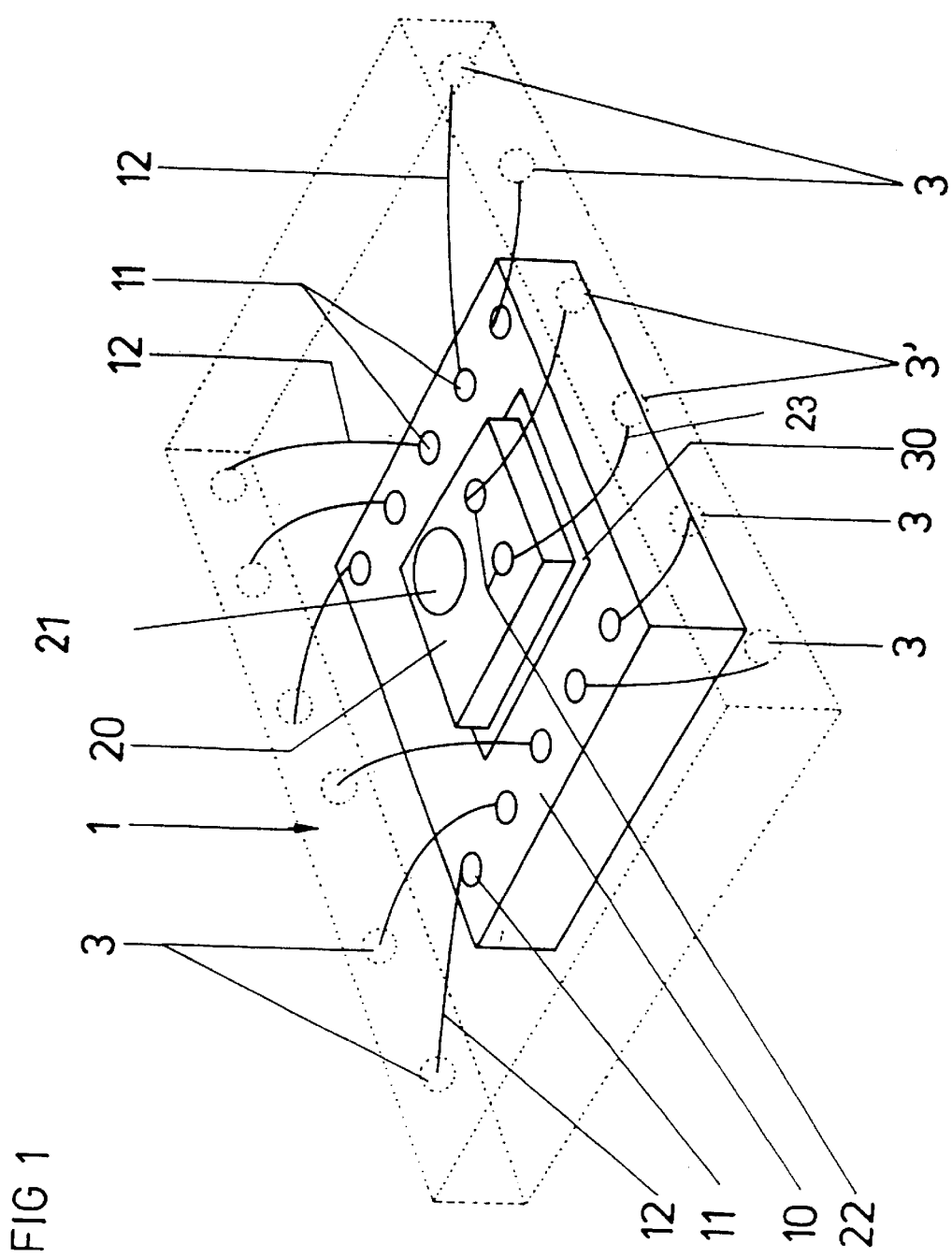
FIG. 1 is a perspective view of a housing of an integrated circuit configuration with a VLSI chip and a temperature sensor chip.

Referring now to the figures of the drawing in detail and first, particularly, to FIG. 1 thereof, there is seen a schematic representation of an integrated circuit configuration according to the invention. The circuit configuration has a housing 1, which is composed, for instance, of plastic. The housing has a multiplicity of externally accessible contact terminals 3, 3'. A semiconductor chip 10 is disposed inside the housing. The semiconductor chip 10 is a VLSI chip, i.e., an integrated circuit having a very high circuit component density (VLSI=very large scale integration). It may be a microprocessor, microcontroller, or a memory chip. The semiconductor chip 10 is contact-connected to the contact terminals 3 of the housing in a manner known per se. Connecting lines 12 are established by bonding wires which electrically connect the terminals 11 on the semiconductor chip 10 to the contact terminals 3.

A temperature sensor chip 20 is disposed in an insulated manner on the semiconductor chip 10. For this purpose, an insulating and heat-conducting layer 30 is arranged between the semiconductor chip 10 and the temperature sensor chip 20. The temperature sensor chip 20 is provided with a temperature sensor 21, which may be connected to an integrated regulating circuit. Terminals 22 of the temperature sensor chip 20 are connected via bonding wires 23 to the contact terminals 3' already mentioned above. As a result, a circuit developer can readily access the connecting lines of the temperature sensor chip 20 and use them e.g. to drive a temperature-controlled fan motor.

In the simplest case, the temperature sensor chip 20 may be a thermal resistor which is seated on the semiconductor chip 10 and whose two terminals are connected to the contact terminals 3' of the housing 1. The sensor may also be a power switch. In addition, it is also possible for intelligent electronics to be integrated in the temperature sensor chip 20, right through to a complete regulating circuit, the output terminals of which are connected to the contact terminals 3' of the housing 1 and/or are already connected to the semiconductor chip 10 internally in the housing 1, for the purpose of safety shutdown of the semiconductor chip in the event of an overtemperature situation.

Figure 2:
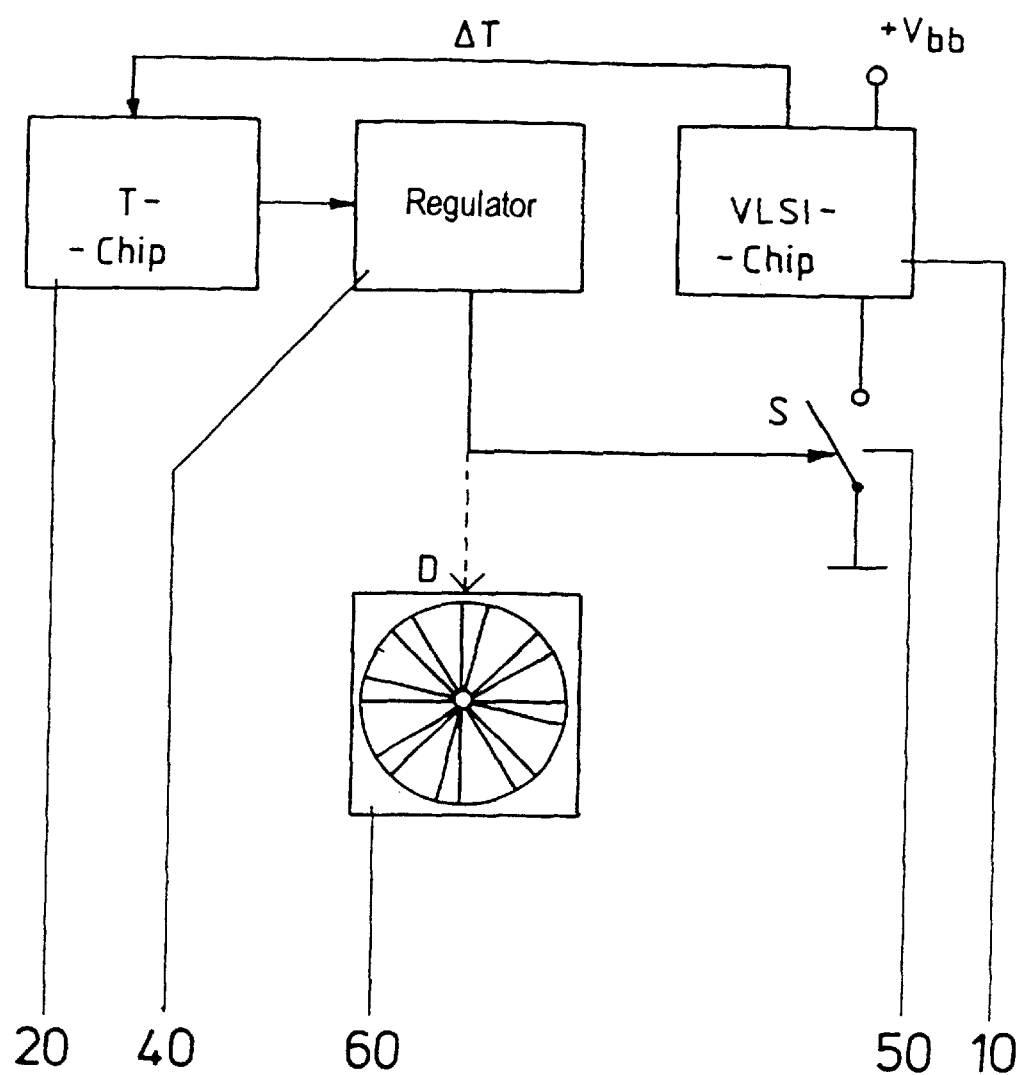
FIG. 2 is a block diagram illustrating the system of FIG. 1.

Referring now to FIG. 2, there is shown, by way of example, a block diagram for a VLSI circuit according to the invention. A current temperature ΔT at the semiconductor chip 10 is acquired by means of the temperature sensor of the temperature sensor chip 20. For this purpose, the temperature sensor should be placed at that location of the semiconductor chip 10 which is the most critical in thermal terms. The present temperature ΔT thus acquired is fed to a regulating circuit 40, which ensures that the temperature at the semiconductor chip 10 is reduced as soon as a predetermined critical temperature value is exceeded.

For this purpose, an actuating signal for a switch 50, which switches off the power supply to the VLSI chip 10, may be provided at the output of the regulating circuit. Therefore, in the exemplary embodiment of FIG. 2, the switch 50 is connected in series with the VLSI chip 10 between a supply potential $V_{bb}$ and ground.

It is also possible, as suggested by the dashed illustration in FIG. 2, for the output of the regulating circuit 40 to be used for driving a fan motor 60. The signal of the regulator thereby regulates or adjusts a rotational speed D of the fan.

In the present circuit configuration it is very essential that the temperature sensor be disposed in direct proximity to the VLSI chip 10 within the housing 1 of the integrated circuit. It is only in this way that the temperature at the critical location of the VLSI chip can be controlled in good time and in a highly accurate manner.

We claim:

1. A temperature-monitored VLSI circuit, comprising:
    a housing with a plurality of externally accessible contact terminals;
    an integrated semiconductor chip disposed in said housing and a plurality of connecting lines electrically connecting said semiconductor chip to respective said contact terminals;
    a temperature sensor chip disposed in thermal contact with said semiconductor chip in said housing, and connecting lines connecting said temperature sensor chip to additional said contact terminals; and
    a regulating circuit for temperature regulation of the VLSI circuit connected to said additional contact terminals.

2. The VLSI circuit according to claim 1, wherein said temperature sensor chip is disposed to be completely insulated from said semiconductor chip.

3. The VLSI circuit according to claim 1, wherein said temperature sensor chip and said semiconductor chip are connected to a common reference-ground potential.

4. The VLSI circuit according to claim 1, wherein said temperature sensor chip and said semiconductor chip are mutually connectible to a common supply potential.

5. The VLSI circuit according to claim 1, wherein said temperature sensor chip generates a digital output signal.

6. The VLSI circuit according to claim 1, wherein said temperature sensor chip generates an analog output signal.

7. The VLSI circuit according to claim 1, wherein an output signal of said temperature sensor chip is a regulating signal for initiating temperature regulation maintaining a temperature in said housing at a location of said temperature sensor chip below a predetermined setpoint.

8. The VLSI circuit according to claim 7, wherein said semiconductor chip is operated at a clock frequency, and the temperature regulation is a reduction in the clock frequency of said semiconductor chip.

9. The VLSI circuit according to claim 7, wherein the temperature regulation is an increase in a cooling air supply to the VLSI circuit.

10. The VLSI circuit according to claim 7, wherein the temperature regulation is a reduction in a voltage supply to said semiconductor chip.

11. The VLSI circuit according to claim 1, which further comprises a fan motor for cooling the VLSI circuit, and wherein said temperature sensor chip includes a power switch connected on an output side thereof for selectively switching said fan motor.

12. The VLSI circuit according to claim 1, wherein said regulating circuit is integrated in said housing.

* * * * *